(12) United States Patent
Atwood et al.

(10) Patent No.: US 9,041,572 B1
(45) Date of Patent: May 26, 2015

(54) TESTING A DIGITAL-TO-ANALOG CONVERTER

(71) Applicant: International Business Machines Corporation, Armonk, NY (US)

(72) Inventors: Eugene R. Atwood, Housatonic, MA (US); Matthew B. Baecher, Newburgh, NY (US); William R. Kelly, Verbank, NY (US); Joseph F. Logan, Raleigh, NC (US); Pinping Sun, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/089,790

(22) Filed: Nov. 26, 2013

(51) Int. Cl.
*H03M 1/10* (2006.01)
*H03M 1/66* (2006.01)

(52) U.S. Cl.
CPC .............. *H03M 1/1071* (2013.01); *H03M 1/66* (2013.01)

(58) Field of Classification Search
CPC ........... G01R 31/2851; G01R 31/2824; G01R 31/3167; G01R 31/31707; H03M 1/66; H03M 1/12; H03M 1/109; H03M 1/662; H03M 1/1071; H03M 1/1095; H03M 1/1009
USPC ......... 341/118, 120; 324/76.12, 73.1, 762.02; 714/742, 724, 738, E11.148
See application file for complete search history.

(56) References Cited

U.S. PATENT DOCUMENTS

| | | | | |
|---|---|---|---|---|
| 5,631,649 A * | 5/1997 | Nakamura | ..................... | 341/144 |
| 5,909,186 A * | 6/1999 | Gohringer | ..................... | 341/120 |
| 6,005,407 A | 12/1999 | Arabi et al. | | |
| 6,326,909 B1 * | 12/2001 | Yamaguchi | ................... | 341/120 |
| 6,408,412 B1 * | 6/2002 | Rajsuman | ..................... | 714/724 |

\* cited by examiner

*Primary Examiner* — Lam T Mai
(74) *Attorney, Agent, or Firm* — Edward J. Lenart; H. Daniel Schnurmann; Kennedy Lenart Spraggins LLP

(57) ABSTRACT

Testing a digital-to-analog converter (DAC), where the test is carried out iteratively for a plurality of digital test signal values, includes: providing the digital test signal to a DAC under test and to a servo; providing, by the DAC under test to a summer, an analog test signal, including converting the digital test signal to the analog test signal; providing, by the summer to an observation latch, a summed signal, including summing the analog test signal and an analog offset signal, the analog offset signal received from a second DAC; providing, by the observation latch to the servo, a sample of the summed signal; providing, by the servo to the second DAC in dependence upon the sample and the digital test signal, a digital offset signal, where the second DAC converts the digital offset signal to the analog offset signal; and storing, as a digital observation, the digital offset signal.

18 Claims, 4 Drawing Sheets

TESTING A DIGITAL-TO-ANALOG CONVERTER

BACKGROUND

1. Technical Field

The technical field is data processing, or, more specifically, methods, systems, and apparatus for testing a digital-to-analog converter (DAC).

2. Description of Related Art

In computer systems today, many components include DACs. Some high speed serial (HSS) links, for example, include a number of DACs. Testing such DACs is often carried out with an analog-to-digital converter (ADC). The ADC, however, must have a higher resolution than the DAC being tested in order to achieve accuracy on the order of the smallest DAC step. The ADC is also an added element and must be part of a non-interfering connection network. The ADC itself must also be tested. Other methods for testing embedded DACs use a form of oscillation testing, usually relying on an integrator and counter to provide test data. These techniques employed to test DACs in the prior art have some inherent detriments. Realization of manufacturing test coverage and discrete observation of such DACs requires specific test circuitry which contributes to the overall area required for a design. A trade-off exists between the cost of test circuits in a design and the specific costs associated with the use of automated test equipment.

SUMMARY

Methods for testing a DAC are disclosed in this specification. Such methods are carried out iteratively for a number of digital test signal values and include: providing the digital test signal to a DAC under test and to a servo; providing, by the DAC under test to a summer, an analog test signal, including converting the digital test signal to the analog test signal; providing, by the summer to an observation latch, a summed signal, including summing the analog test signal and an analog offset signal, the analog offset signal received from a second DAC; providing, by the observation latch to the servo, a sample of the summed signal; providing, by the servo to the second DAC in dependence upon the sample and the digital test signal, a digital offset signal, where the second DAC converts the digital offset signal to the analog offset signal; and storing, as a digital observation, the digital offset signal.

Also disclosed in this specification are systems for testing a DAC. Such systems include a DAC under test, a servo, a summer, a second DAC, and an observation latch. In such systems: the DAC under test is configured to receive, iteratively for a plurality of digital test signal values, a digital test signal, and for each iteration: the DAC under test is further configured to convert the digital signal to an analog test signal and provide the analog test signal to the summer; the summer is configured to provide, to the observation latch, a summed signal by summing the analog test signal and an analog offset signal, the analog offset signal received from the second DAC; the observation latch is configured to provide, to the servo, a sample of the summed signal; the servo is configured to receive the digital test signal and provide, to the second DAC in dependence upon the sample and the digital test signal, a digital offset signal, where the second DAC converts the digital offset signal to the analog offset signal; and a register is configured to store the digital offset signal as a digital observation.

Also disclosed in this specification are high speed serial (HSS) link receivers. Such a receiver may include a DAC under test, servo, a summer, a second DAC, and an observation latch. In such a receiver, the DAC under test is configured to receive, iteratively for a plurality of digital test signal values, a digital test signal, and for each iteration: the DAC under test is further configured to convert the digital signal to an analog test signal and provide the analog test signal to the summer; the summer is configured to provide, to the observation latch, a summed signal by summing the analog test signal and an analog offset signal, the analog offset signal received from the second DAC; the observation latch is configured to provide, to the servo, a sample of the summed signal; the servo is configured to receive the digital test signal and provide, to the second DAC in dependence upon the sample and the digital test signal, a digital offset signal, where the second DAC converts the digital offset signal to the analog offset signal; and a register is configured to store the digital offset signal as a digital observation.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
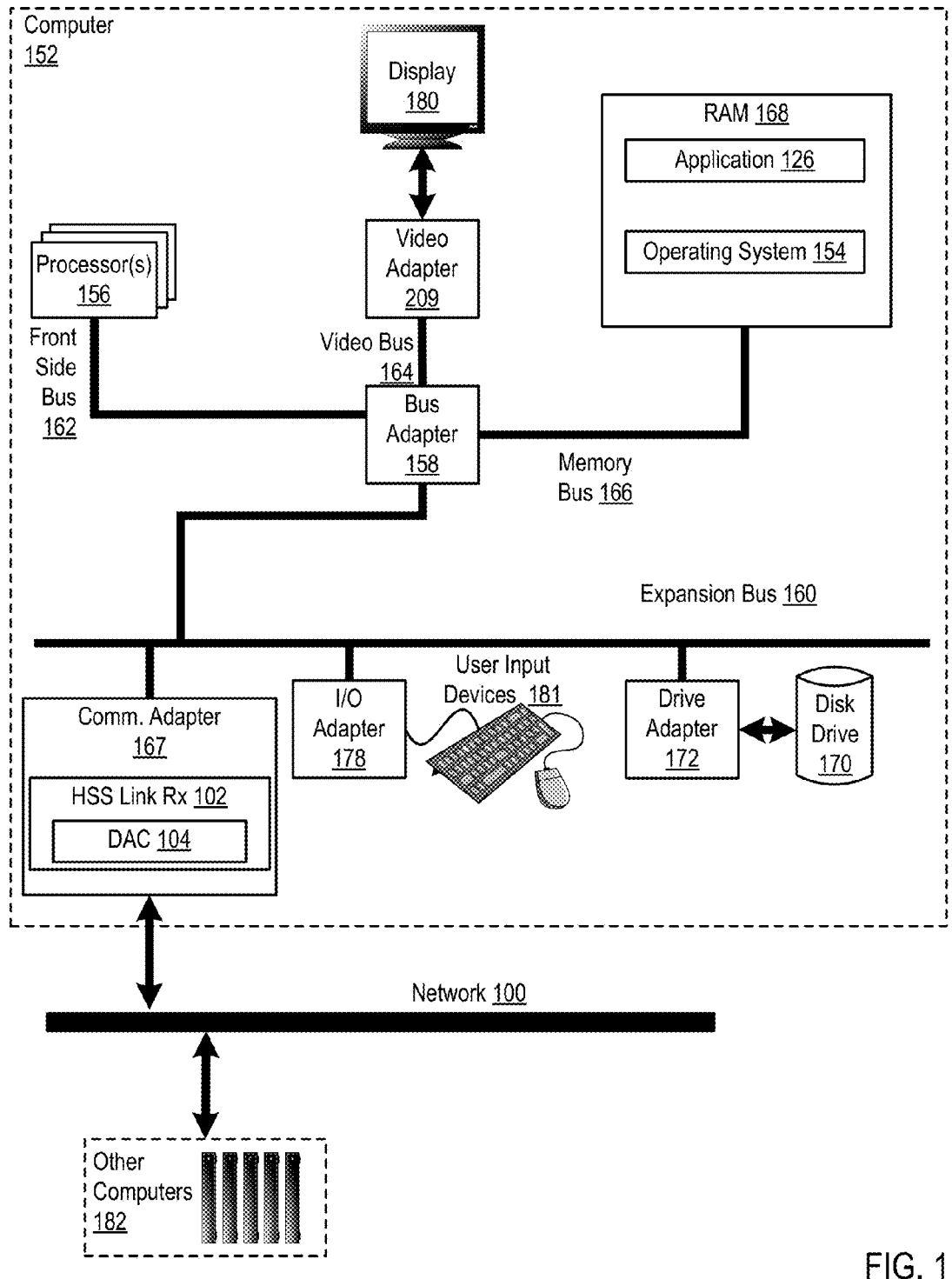
FIG. 1 sets forth a network diagram of an example computer system that includes a high speed serial (HSS) link receiver configured for testing a DAC according to embodiments of the present invention.

Exemplary methods, systems, and apparatus for testing a DAC in accordance with the present invention are described with reference to the accompanying drawings, beginning with FIG. 1. FIG. 1 sets forth a network diagram of an example computer system that includes a high speed serial (HSS) link receiver configured for testing a DAC according to embodiments of the present invention.

FIG. 1 sets forth a block diagram of automated computing machinery comprising an exemplary computer (152) useful in testing a DAC according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is an application program (126), a module of computer program instructions for carrying out user-level data processing tasks. Also stored in RAM (168) is an operating system (154). Operating systems useful testing a DAC according to embodiments of the present invention include UNIX™, Linux™, Microsoft XP™, AIX™, IBM's i5/OS™, and others as will occur to those of skill in the art. The operating system (154) and application program (126) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for testing a DAC according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters that may include DACs according to embodiments of the present invention include modems for wired dial-up communications, Ethernet (IEEE 802.3) adapters for wired data communications, and 802.11 adapters for wireless data communications among others.

The example communications adapter (167) of FIG. 1 includes a high speed serial link receiver (102). The high speed serial link receiver (102) in the example of FIG. 1 may include a number of digital-to-analog converters (104) along with other circuitry not shown here. Programs stored on the hard disk drive (170) and executing in RAM (168) may communicate to the HSS links by various means, including for example by I/O adapter ports, a bus network, an IEEE 1149.1 port, or other communication link.

The example HSS link receiver (102) may be configured for testing a DAC in accordance with embodiments of the present invention. To that end, the HSS link receiver (102) may include, in addition to a DAC (104) under test, a servo, a summer, a second DAC, and an observation latch. Each of these components is described in further detail with respect to FIG. 2 below.

The DAC (104) to be tested of the HSS link receiver (102) along with the servo, summer, and observation latch may be components of a DFE (Decision Feedback Equalizer) of the receiver. That is, when not utilized for testing the DAC (104), these components may be utilized to equalized signals in the receiver. More specifically, the servo and observation latch may be used to reduce signal to noise effects caused by process variance of analog circuitry of the HSS link.

A DFE is, generally, a module of automated computing machinery, such as a circuit, for reversing the distortion incurred by a signal transmitted through a data communications channel. A signal transmitted through a data communications channel may be distorted, for example, by intersymbol interference in which a previously received signal impacts a presently received signal. A DFE implemented in the receiver (102) of FIG. 1 may augment a standard linear equalizer by adjusting an incoming signal in dependence upon information gathered during the receipt of previous signals.

When under test, the DAC (104) is configured to receive, iteratively for a plurality of digital test signal values, a digital test signal. That is, a module of the receiver (102) may test the DAC over a variety of values of a digital signal. Consider, providing an 8-bit binary string to the DAC. A module that initiates the testing of the DAC (104) may provide the following bit patterns in iterations: 00000001, 00000010, 00000011, 00000111, and so on for each subsequent value until 11111111. Readers of skill in the art will recognize that this is but one example set of values to be provided to the DAC (104) under test, over multiple iterations. Other values may be utilized as will occur to readers of skill in the art.

For each iteration, the DAC under test is also configured to convert the digital signal to an analog test signal and provide the analog test signal to the summer. The summer is configured to provide, to the observation latch, a summed signal by summing the analog test signal and an analog offset signal. The analog offset signal is a signal received from the second DAC. In a first iteration the analog offset signal may be of no value. In and subsequent iteration, the analog offset signal is a converted digital offset signal that represents a value utilized to correct for offsets in the DAC under test. Such a value is provided by the servo as described next.

The observation latch is configured to provide, to the servo, a sample of the summed signal. The servo is configured to receive the digital test signal, along with the sample of summed signal, and provide, to the second DAC in dependence upon the sample and the digital test signal, a digital offset signal. The second DAC converts the digital offset signal to the analog offset signal and feeds back the offset to the summer to correct for any unexpected deviations or offsets by the DAC (104) under test. It is noted that deviations and offsets may be provided by circuitry other than the DAC under test itself. A register in the HSS link receiver (102) may be configured to store the digital offset signal as a digital observation.

In some embodiments, the digital observation of each iteration is stored in a receiver and utilized as test results for analyzing the operation of the DAC (104). In other embodiments, a difference of a digital observation for one iteration and a previous digital observation is calculated. In these embodiments, the difference is stored in the register. Further, the difference may be compared, at each iteration, to a range of acceptable values (called 'acceptability criteria'). If the difference falls outside of the range of acceptable values, a flag in the register may be raised. In this way, any iteration in which the DAC fails to pass the test results in a notification stored in a user-accessible register location. In other embodiments, the differences of the iterations may be averaged after completion of the test or throughout the test and the average may be compared to the range of acceptable values. Readers of skill in the art will recognize that the testing as described here may be initiated and completed with components completely within a single chip and without user interaction. The result of the test may be configured as a single pass/fail flag such that a user (at the manufacturer, for example) may be notified if a failure exists.

Testing a DAC, such as the DAC (104) of the HSS link receiver (102) in the example of FIG. 1, in accordance with embodiments of the present invention may be controlled by a manufacturing test system similar to the computer in the example of FIG. 1. Such a computer may include automated test equipment (ATE). Such a computer may program the initial conditions of the test and change to a second condition. Such a computer may be capable of controlling voltage and time excitations of the circuitry within the HSS link receiver. Such a computer may be capable of observing the results of the testing as well as emulating various forms of communication to the HSS link and a physical chip (PHY) component of the HSS link.

The PHY component of the system may be configured to find the magnitude of the applied offset and, as applied iteratively, handle storing digital values and calculating the digital difference value. The entire test, variations and analysis can be executed within the manufacturing test computer system. In the manufacturing test computer system it is generally inefficient to read digital values from the chip due to the time required to read such values. Thus, the pass/fail determinate result for ATE can operate on "expected" data very efficiently.

The components, computers, and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
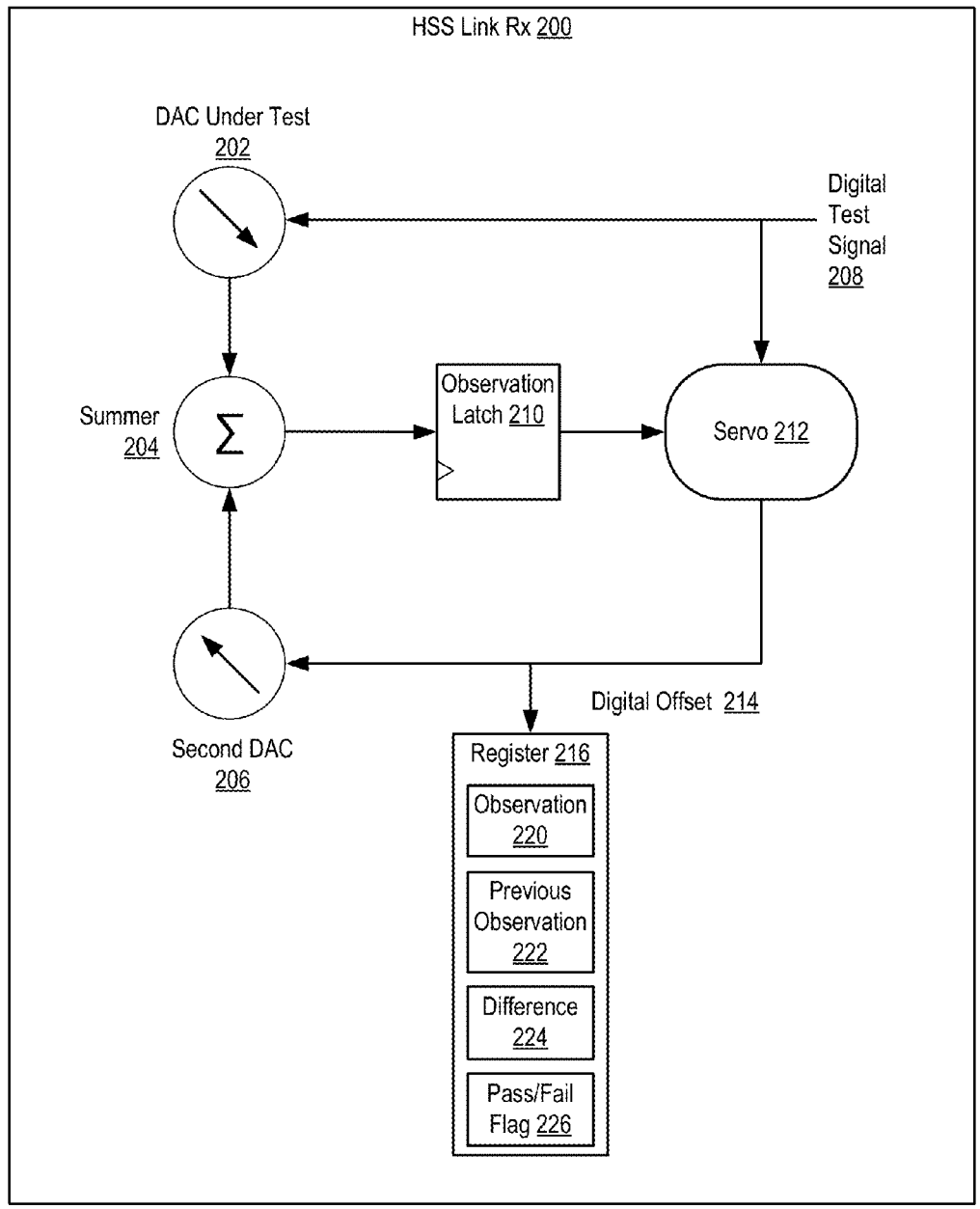
FIG. 2 sets forth a block diagram of an example HSS link receiver configured for testing a DAC according to embodiments of the present invention.

For further explanation, FIG. 2 sets forth a block diagram of an example HSS link receiver (200) configured for testing a DAC according to embodiments of the present invention. The Example HSS link receiver of FIG. 2 includes an embedded DAC (202) to be tested, a servo (212), a summer (204), a second DAC (206), and an observation latch (210).

The DAC (202) under test is configured to receive, iteratively for a plurality of digital test signal values, a digital test signal (208). The same digital test signal (208) is also provided to the servo (212). For each iteration of the digital test signal (208), the DAC under test convert the digital test signal to an analog test signal and provides the analog test signal to the summer (204).

The servo (212) provides a digital offset signal (214), described below in greater detail, to the second DAC (206). The second DAC (206) converts the digital offset signal (214) to an analog offset signal and provides the analog offset signal to the summer (204). The summer (204) then, sums the analog test signal and the analog offset signal and provides the summed signal to the observation latch (210).

The observation latch (210) is configured to provide, to the servo, a sample of the summed signal. That is, the observation latch is configured to latch in a value observed at the input of the latch (210). The latch may operate on a clock (not depicted in FIG. 2) that causes the latch to latch in values at a high rate. Depending on the value received at the input, the observation latch will provide at its output either a 1 or 0. The observation latch (210), in some embodiments, may be implemented as a differential latch.

The servo is configured to determine an offset based on the digital test signal (208) and the sampled signal provided by the observation latch. Effectively, the servo is a closed loop system which utilizes information provided by the latch and other digital state information to drive the second DAC digitally to a value which minimizes the difference in the effect of the DAC under test and the second DACs influence on the summer. Servers may implemented various transfer functions, for example proportional, derivative, integration, or lookup transfer functions. The server may be configured with information to correct errors caused by DC offsets in the DAC under test, leakage in other components, and the like. The servo, then, utilizes the original digital test signal (208) along with an expected result from the observation latch, to determine whether and to what amount an offset is needed. The servo (212) then provides that offset in digital form. The digital offset signal (214) is provided by the servo to the second DAC (206).

It is noted, that while only a single transmission line is depicted here for carrying the digital test signal (208) and the digital offset signal (214), each of these transmission lines may be implemented in a variety of ways. For example, the digital test signal and digital offset signal may be transmitted on a bus or other multi-line configuration.

The second DAC (206) may then convert the digital offset signal to the analog offset signal and provided the analog offset signal to the summer (204) as described above.

In some embodiments, a register is configured to store the digital offset signal as a digital observation on each iteration of the digital test signal. The HSS link receiver (200) of FIG. 2 may also include logic (in the form of register (216) in FIG. 2) configured to determine a difference between a digital observation (220) of one iteration and a digital observation (222) of a previous iteration and store the difference (224) in the register.

The HSS link receiver (200) of FIG. 2 may also include logic, in the form of the register (216) of FIG. 2, configured to determine, in dependence upon the difference, whether the DAC under test meets acceptability criteria. If the DAC does not meet the acceptability criteria, the register may store a flag (226) that represents a notification to a user of such a failure.

Although the DAC under test (202) in the example of FIG. 2 is implemented in a HSS link receiver (200), readers of skill in the art will recognize that testing such a DAC may be useful for DACs implemented in a variety of ways including, for example, in a very large scale integrated (VLSI) circuit.

Figure 3:
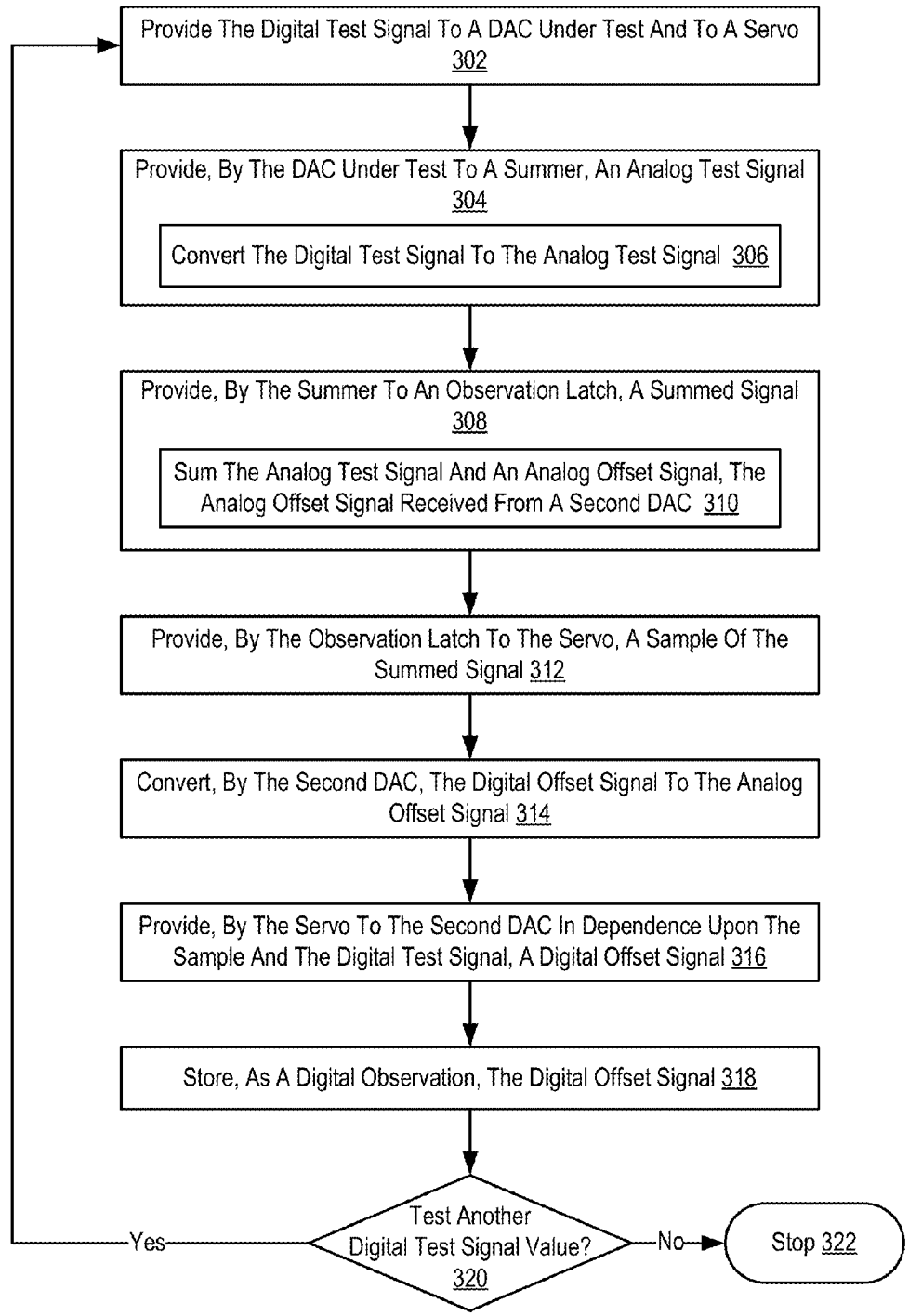
FIG. 3 sets forth a flow chart illustrating an exemplary method for testing a DAC in accordance with embodiments of the present invention.

For further explanation, FIG. 3 sets forth a flow chart illustrating an exemplary method for testing a DAC in accordance with embodiments of the present invention. The method of FIG. 3 includes providing (302) the digital test signal to a DAC under test and to a servo. The digital test signal may be provided by a firmware module or the like configured for providing such testing values.

The method of FIG. 3 also includes providing (304), by the DAC under test to a summer, an analog test signal. In the method of FIG. 3, providing (304) the analog test signal includes converting (306) the digital test signal to the analog test signal.

The method of FIG. 3 also includes providing (308), by the summer to an observation latch, a summed signal. In the example of FIG. 3, providing (308) the summed signal to the observation latch is carried out by summing (310) the analog test signal and an analog offset signal, where the analog offset signal received from a second DAC as described below.

The method of FIG. 3 also includes providing (312), by the observation latch to the servo, a sample of the summed signal. In the method of FIG. 3, the second DAC converts (314) the digital offset signal to the analog offset signal. The method of FIG. 3 also include providing (316), by the servo to the second DAC in dependence upon the sample and the digital test signal, a digital offset signal. The method of FIG. 3 also includes storing (318), as a digital observation, the digital offset signal. It is noted that the digital offset signal is proportional to all offsets which contribute to the summing node, not just those provided by the DAC under test. One example may be where all controllable offset sources are set to minimum values with the digital offset result the test being proportional to all voltage and current inherent in the result of the circuit manufacturing process. Such a proportional digital result may be utilized as an observation to determine whether the circuitry passes acceptability criteria.

The method of FIG. 3 continues by determining (320) whether another digital test signal value is available for testing. If not, the test is stopped (322). If so, another iteration of the digital test signal is provided (302) and the method of FIG. 3 repeats.

Figure 4:
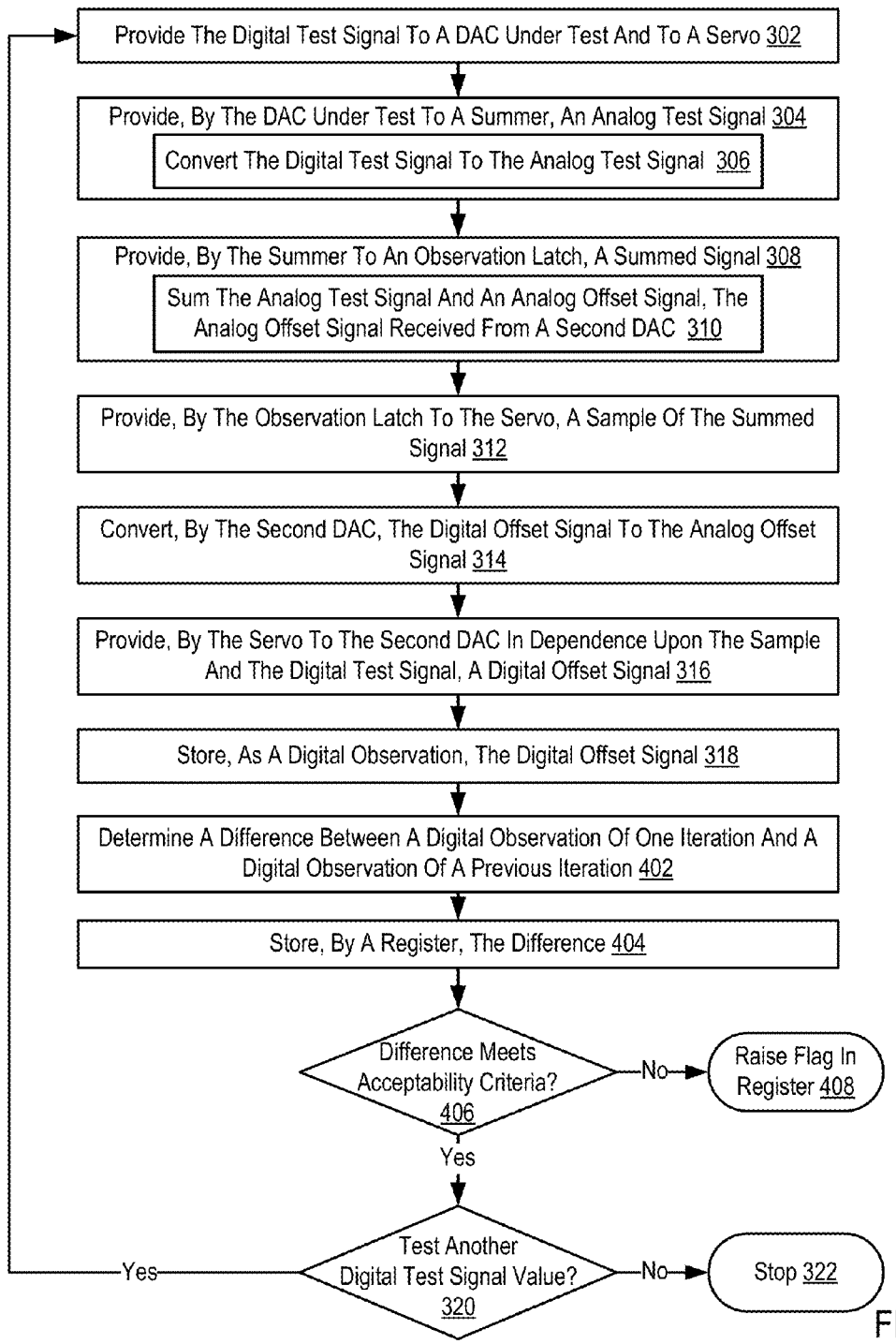
FIG. 4 sets forth a flow chart illustrating another exemplary method for testing a DAC in accordance with embodiments of the present invention.

For further explanation, FIG. 4 sets forth a flow chart illustrating another exemplary method for testing a DAC in accordance with embodiments of the present invention. The method of FIG. 4 is similar to the method of FIG. 3 in that the method of FIG. 4 includes providing (302) the digital test signal to a DAC under test and to a servo; providing (304) an analog test signal; providing (308) a summed signal; providing (312) a sample of the summed signal; providing (316) a digital offset signal, wherein the second DAC converts the digital offset signal to the analog offset signal; and storing (318) the digital offset signal.

The method of FIG. 4 differs from the method of FIG. 3, however, in that the method of FIG. 3 includes determining (402) a difference between a digital observation of one iteration and a digital observation of a previous iteration. Determining (402) a difference between a digital observation of one iteration and a digital observation of a previous iteration removes the necessity of testing for an absolute value of the output of the DAC. By testing for relative differences, DC offsets present throughout the circuit and affecting the DAC's absolute output while not affective its performance otherwise are ignored. The method of FIG. 4 also includes storing (404) the difference by a register.

The method of FIG. 4 also includes determining (406), in dependence upon the difference, whether the DAC under test meets acceptability criteria. Determining (406) whether the DAC under test meets acceptability criteria may be carried out by determining whether the difference falls within a range of acceptable values. The values may be programmed into the system by a user. If the difference falls outside that range, it can be inferred that the DAC does not operate linearly for example. To that end, if the DAC under test does not meet acceptability criteria, the method of FIG. 4 continues by raising a flag in a register at a location designated for such purpose. It is noted that in the example of FIG. 4, determining (406) whether the difference meets acceptability criteria is described and depicted as occurring once for each iteration of the method. In other embodiments, however, determining (406) whether the difference meets acceptability criteria may be carried out, once, after the last iteration of the testing method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/ or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of testing a digital-to-analog converter (DAC), the method carried out iteratively for a plurality of digital test signal values, the method comprising:
   providing the digital test signal to a DAC under test and to a servo;
   providing, by the DAC under test to a summer, an analog test signal, including converting the digital test signal to the analog test signal;
   providing, by the summer to an observation latch, a summed signal, including summing the analog test signal and an analog offset signal, the analog offset signal received from a second DAC;
   providing, by the observation latch to the servo, a sample of the summed signal;
   providing, by the servo to the second DAC in dependence upon the sample and the digital test signal, a digital offset signal, wherein the second DAC converts the digital offset signal to the analog offset signal; and
   storing, as a digital observation, the digital offset signal.

2. The method of claim 1 further comprising:
   determining a difference between a digital observation of one iteration and a digital observation of a previous iteration; and
   storing by a register the difference.

3. The method of claim 2 further comprising:
   determining, in dependence upon the difference, whether the DAC under test meets acceptability criteria.

4. The method of claim 1 wherein the DAC under test comprises a DAC of a receiver in a High Speed Serial (HSS) link.

5. The method of claim 4 wherein the servo comprises a servo that, when not utilized for testing the DAC under test, is configured for reducing signal to noise effects caused by process variance of analog circuitry of the HSS link.

6. The method of claim 1 wherein the DAC under test comprises a DAC embedded in a very large scale integrated (VLSI) circuit.

7. A system for testing a digital-to-analog converter (DAC), the system comprising:
   a DAC under test;
   a servo;
   a summer;
   a second DAC; and
   an observation latch, wherein:
   the DAC under test is configured to receive, iteratively for a plurality of digital test signal values, a digital test signal, and for each iteration:
   the DAC under test is further configured to convert the digital test signal to an analog test signal and provide the analog test signal to the summer;
   the summer is configured to provide, to the observation latch, a summed signal by summing the analog test signal and an analog offset signal, the analog offset signal received from the second DAC;
   the observation latch is configured to provide, to the servo, a sample of the summed signal;
   the servo is configured to receive the digital test signal and provide, to the second DAC in dependence upon the sample and the digital test signal, a digital offset signal, wherein the second DAC converts the digital offset signal to the analog offset signal; and
   a register is configured to store the digital offset signal as a digital observation.

8. The system of claim 7 further comprising:
   logic configured to determine a difference between a digital observation of one iteration and a digital observation of a previous iteration; and
   logic configured to store the difference in a register.

9. The system of claim 8 further comprising:
   logic configured to determine, in dependence upon the difference, whether the DAC under test meets acceptability criteria.

10. The system of claim 7 wherein the DAC under test comprises a DAC of a receiver in a High Speed Serial (HSS) link.

11. The system of claim 10 wherein the servo comprises a servo that, when not utilized for testing the DAC under test, is configured for reducing signal to noise effects caused by process variance of analog circuitry of the HSS link.

12. The system of claim 7 wherein the DAC under test comprises a DAC embedded in a very large scale integrated (VLSI) circuit.

13. A high speed serial (HSS) link receiver, comprising:
a DAC under test;
a servo;
a summer;
a second DAC; and
an observation latch, wherein:
the DAC under test is configured to receive, iteratively for a plurality of digital test signal values, a digital test signal, and for each iteration:
the DAC under test is further configured to convert the digital test signal to an analog test signal and provide the analog test signal to the summer;
the summer is configured to provide, to the observation latch, a summed signal by summing the analog test signal and an analog offset signal, the analog offset signal received from the second DAC;
the observation latch is configured to provide, to the servo, a sample of the summed signal;
the servo is configured to receive the digital test signal and provide, to the second DAC in dependence upon the sample and the digital test signal, a digital offset signal, wherein the second DAC converts the digital offset signal to the analog offset signal; and
a register is configured to store the digital offset signal as a digital observation.

14. The HSS link receiver of claim 13 further comprising:
logic configured to determine a difference between a digital observation of one iteration and a digital observation of a previous iteration; and
logic configured to store the difference in a register.

15. The HSS link receiver of claim 14 further comprising:
logic configured to determine, in dependence upon the difference, whether the DAC under test meets acceptability criteria.

16. The HSS link receiver of claim of claim 13 wherein the DAC under test comprises a DAC of a receiver in a High Speed Serial (HSS) link.

17. The HSS link receiver of claim of claim 16 wherein the servo comprises a servo that, when not utilized for testing the DAC under test, is configured for reducing signal to noise effects caused by process variance of analog circuitry of the HSS link.

18. The system of claim 17 wherein the DAC under test comprises a DAC embedded in a very large scale integrated (VLSI) circuit.

* * * * *